US010151029B2

(12) United States Patent
Fukiage et al.

(10) Patent No.: US 10,151,029 B2
(45) Date of Patent: Dec. 11, 2018

(54) SILICON NITRIDE FILM FORMING METHOD AND SILICON NITRIDE FILM FORMING APPARATUS

(71) Applicant: TOKYO ELECTRON LIMITED, Tokyo (JP)

(72) Inventors: Noriaki Fukiage, Nirasaki (JP); Takeshi Oyama, Nirasaki (JP); Jun Ogawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/669,444

(22) Filed: Aug. 4, 2017

(65) Prior Publication Data

US 2018/0037992 A1 Feb. 8, 2018

(30) Foreign Application Priority Data

Aug. 8, 2016 (JP) .................................. 2016-155746
Apr. 26, 2017 (JP) .................................. 2017-087187

(51) Int. Cl.
| H01L 21/02 | (2006.01) |
| C23C 16/455 | (2006.01) |
| H01L 21/687 | (2006.01) |
| C23C 16/34 | (2006.01) |
| C23C 16/52 | (2006.01) |

(52) U.S. Cl.
CPC ...... *C23C 16/45529* (2013.01); *C23C 16/345* (2013.01); *C23C 16/45536* (2013.01); *C23C 16/45542* (2013.01); *C23C 16/45551* (2013.01); *C23C 16/52* (2013.01); *H01L 21/0217* (2013.01); *H01L 21/0228* (2013.01); *H01L 21/02186* (2013.01); *H01L 21/02274* (2013.01); *H01L 21/68764* (2013.01); *H01L 21/68771* (2013.01)

(58) Field of Classification Search
CPC ....... H01L 21/217; H01L 21/02; H01L 21/68; H01L 21/687; H01L 21/02186; H01L 21/02274; H01L 21/0228; H01L 21/68764; H01L 21/68771
USPC .......................................................... 438/763
See application file for complete search history.

(56) References Cited

U.S. PATENT DOCUMENTS

| 2005/0174876 A1* | 8/2005 | Katoh ................... B82Y 10/00 365/232 |
| 2014/0357046 A1* | 12/2014 | Hsueh ................. H01L 45/1608 438/382 |
| 2015/0050806 A1* | 2/2015 | Park .................. H01L 21/28562 438/643 |

FOREIGN PATENT DOCUMENTS

| JP | 2004-281853 A | 10/2004 |
| JP | 2016-115814 A | 6/2016 |

* cited by examiner

*Primary Examiner* — Chuong A Luu
(74) *Attorney, Agent, or Firm* — Nath, Goldberg & Meyer; Jerald L. Meyer

(57) ABSTRACT

A silicon nitride film forming method for forming a silicon nitride film on a substrate to be processed, includes forming a silicon nitride film doped with a predetermined amount of titanium by repeating, a predetermined number of times, forming a silicon nitride film by repeating, a first number of times, a process of causing a silicon source gas to be adsorbed onto the substrate and a process of nitriding the adsorbed silicon source gas with plasma of a nitriding gas, and forming a titanium nitride film by repeating, a second number of times, a process of causing a titanium source gas containing chlorine to be adsorbed onto the substrate and a process of nitriding the adsorbed titanium source gas with the plasma of the nitriding gas.

12 Claims, 11 Drawing Sheets

SILICON NITRIDE FILM FORMING METHOD AND SILICON NITRIDE FILM FORMING APPARATUS

CROSS-REFERENCE TO RELATED APPLICATIONS

This application is based upon and claims the benefit of priority from Japanese Patent Application Nos. 2016-155746 and 2017-087187, filed on Aug. 8, 2016 and Apr. 26, 2017, respectively, the entire contents of which are incorporated herein by reference.

TECHNICAL FIELD

The present disclosure relates to a silicon nitride film forming method and a silicon nitride film forming apparatus.

BACKGROUND

In a semiconductor integrated circuit device, a silicon nitride film is widely used not only as an insulating material such as a gate insulating film or the like but also as a material such as an etching stopper, a sidewall spacer, a stress liner or the like.

A chemical vapor deposition method (CVD method) has been widely used for such a silicon nitride film forming process. In recent years, with the progress of miniaturization and high integration of semiconductor devices, from the viewpoint of improving characteristics such as an insulation property and the like, attention has been paid to an atomic layer deposition method (ALD method) capable of forming a high-quality film at a lower temperature than the film formation using the conventional CVD method.

As a technique for forming a silicon nitride film by the ALD method, there has been proposed a technique in which a dichlorosilane (DCS; $SiH_2Cl_2$) gas, which is a Si source gas, and an ammonia ($NH_3$) gas, which is a nitriding gas, are used and supplied alternately. When supplying the $NH_3$ gas, high-frequency power is applied to generate plasma, thereby promoting a nitriding reaction.

Although a high-quality silicon nitride film can be obtained by the ALD method, there is a growing demand for a dry etching resistance in the silicon nitride film. It is difficult to obtain a sufficient dry etching resistance in a silicon nitride film produced by a conventional ALD method.

SUMMARY

Some embodiments of the present disclosure provide a silicon nitride film forming method and a silicon nitride film forming apparatus capable of forming a silicon nitride film having a high film quality and a sufficient dry etching resistance.

According to one embodiment of the present disclosure, there is provided a silicon nitride film forming method for forming a silicon nitride film on a substrate to be processed, including: forming a silicon nitride film doped with a predetermined amount of titanium by repeating, a predetermined number of times, forming a silicon nitride film by repeating, a first number of times, a process of causing a silicon source gas to be adsorbed onto the substrate and a process of nitriding the adsorbed silicon source gas with plasma of a nitriding gas, and forming a titanium nitride film by repeating, a second number of times, a process of causing a titanium source gas containing chlorine to be adsorbed onto the substrate and a process of nitriding the adsorbed titanium source gas with the plasma of the nitriding gas.

According to another embodiment of the present disclosure, there is provided a silicon nitride film forming apparatus for forming a silicon nitride film on a substrate to be processed, including: a vacuum container whose interior is kept in vacuum; a rotary table provided inside the vacuum container and configured to revolve in a state in which a plurality of substrates to be processed is mounted; an adsorption region provided inside the vacuum container and configured to cause a silicon source gas or a titanium source gas to be adsorbed onto the substrate, the adsorption region including a silicon source gas supply mechanism and a titanium source gas supply mechanism; a nitriding region provided inside the vacuum container and configured to nitride the adsorbed silicon source gas or the adsorbed titanium source gas with plasma of a nitriding gas; and a control part configured to execute control so as to carry out: a silicon nitride film forming act in which a process of rotating the rotary table in a state which the substrates are mounted on the rotary table, supplying the silicon source gas from the silicon source gas supply mechanism when the substrates pass through the adsorption region, and causing the silicon source gas to be adsorbed onto the substrates is performed, a process of nitriding the adsorbed silicon source gas with the plasma of the nitriding gas when the substrates pass through the nitriding region is performed, and a silicon nitride film is formed by rotating the rotary table a first number of times so as to repeat, a first number of times, the process of causing the silicon source gas to be adsorbed and the process of nitriding the adsorbed silicon source gas; and a titanium nitride film forming act in which a process of rotating the rotary table, supplying the titanium source gas from the titanium source gas supply mechanism when the substrates pass through the adsorption region, and causing the titanium source gas to be adsorbed onto the substrates is performed, a process of nitriding the adsorbed titanium source gas with the plasma of the nitriding gas when the substrates pass through the nitriding region is performed, and a titanium nitride film is formed by rotating the rotary table a second number of times so as to repeat, a second number of times, the process of causing the titanium source gas to be adsorbed and the process of nitriding the adsorbed titanium source gas, wherein the control part is configured to execute control so as to repeat, a predetermined number of times, the silicon nitride film forming act and the titanium nitride film forming act.

According to another embodiment of the present disclosure, there is provided a non-transitory computer-readable storage medium operating on a computer and storing a program for controlling a silicon nitride film forming apparatus, wherein the program is configured to, when executed, have the computer control the silicon nitride film forming apparatus so that the silicon nitride film forming method described above is performed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Film Forming Apparatus>

First, one example of a silicon nitride film forming apparatus capable of carrying out a silicon nitride film forming method according to the present disclosure will be described.

Figure 1:
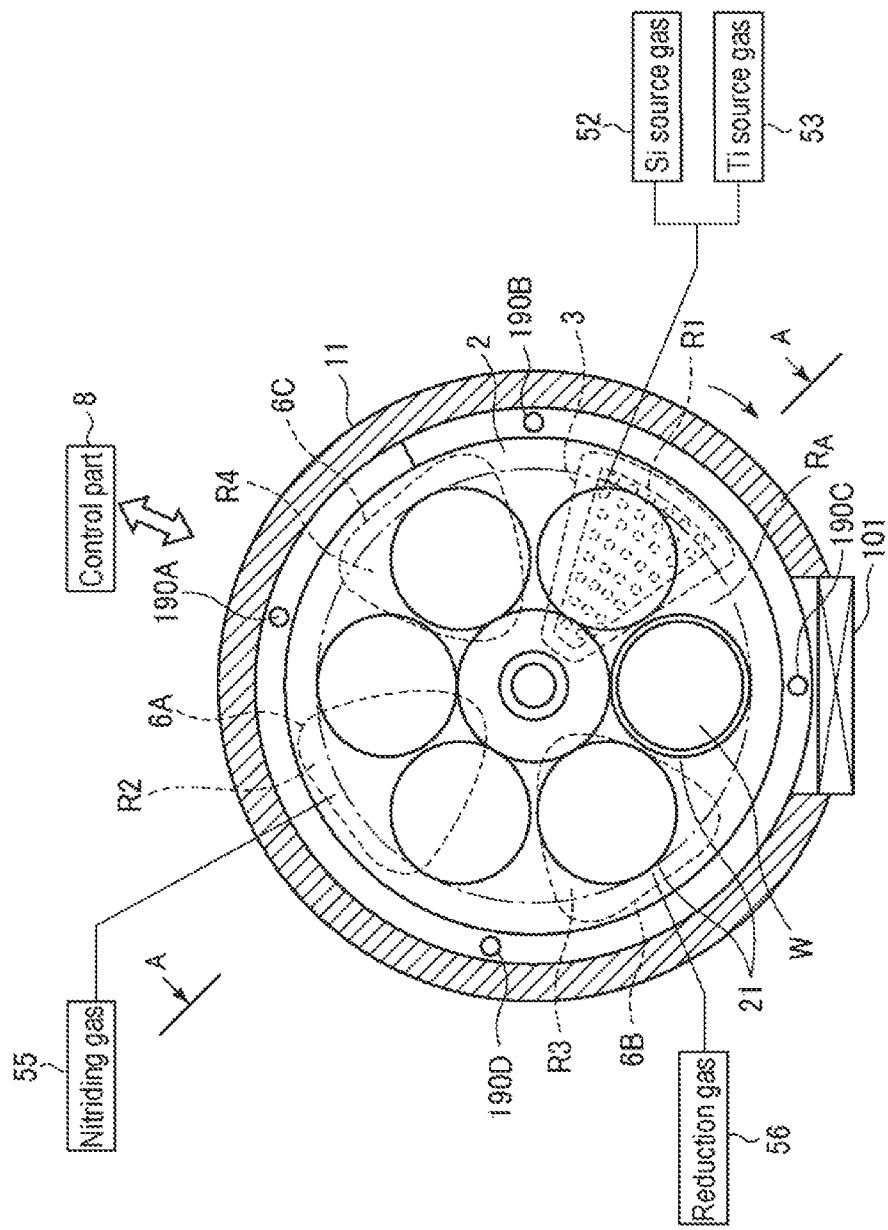
FIG. 1 is a horizontal sectional view showing one example of a film forming apparatus for carrying oust a film forming method according to the present disclosure.
Figure 2:
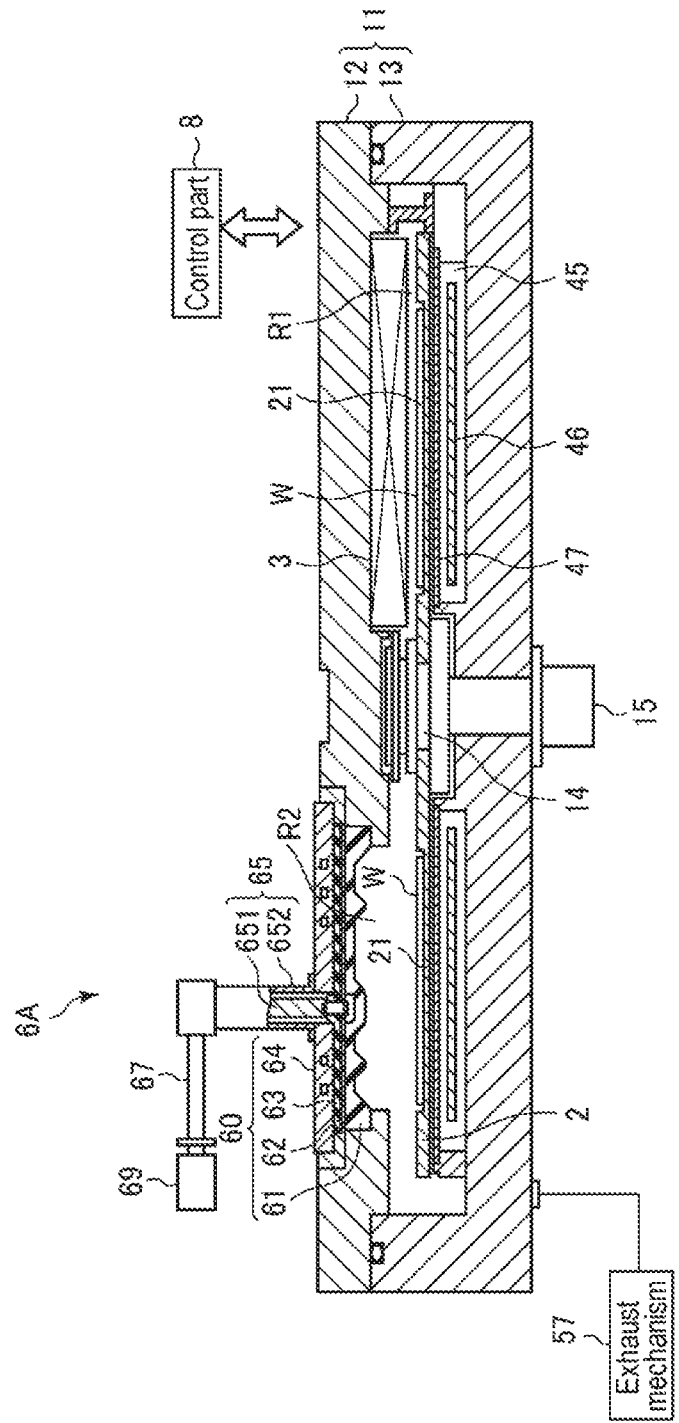
FIG. 2 is a vertical sectional view of the film forming apparatus taken along A-A' in FIG. 1.
Figure 3:
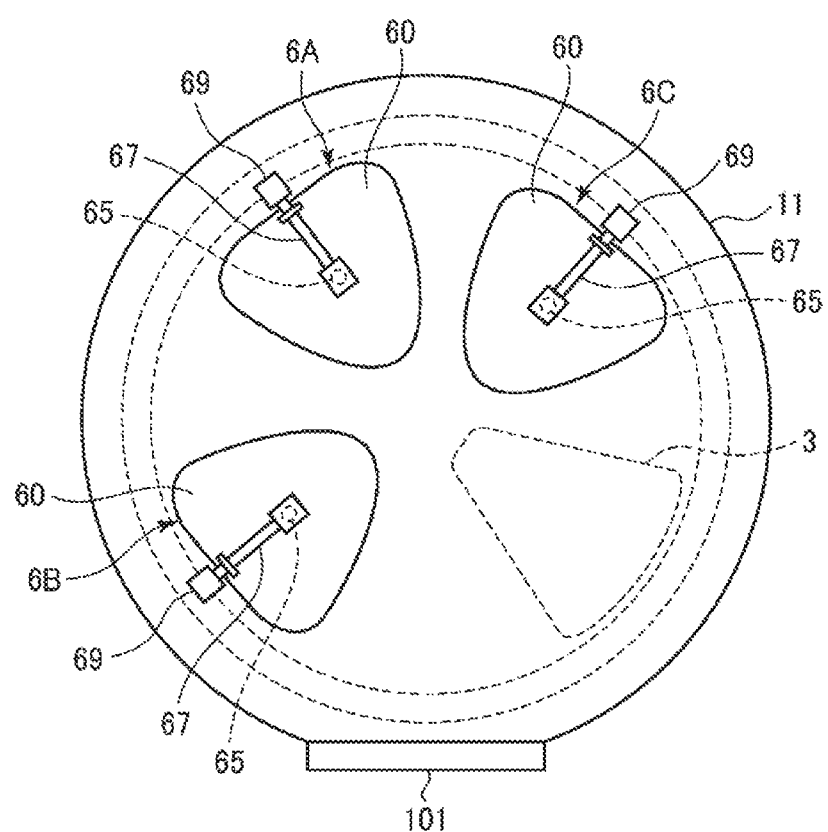
FIG. 3 is a plan view showing the film forming apparatus for carrying out a film forming method according to the present disclosure.
Figure 4:
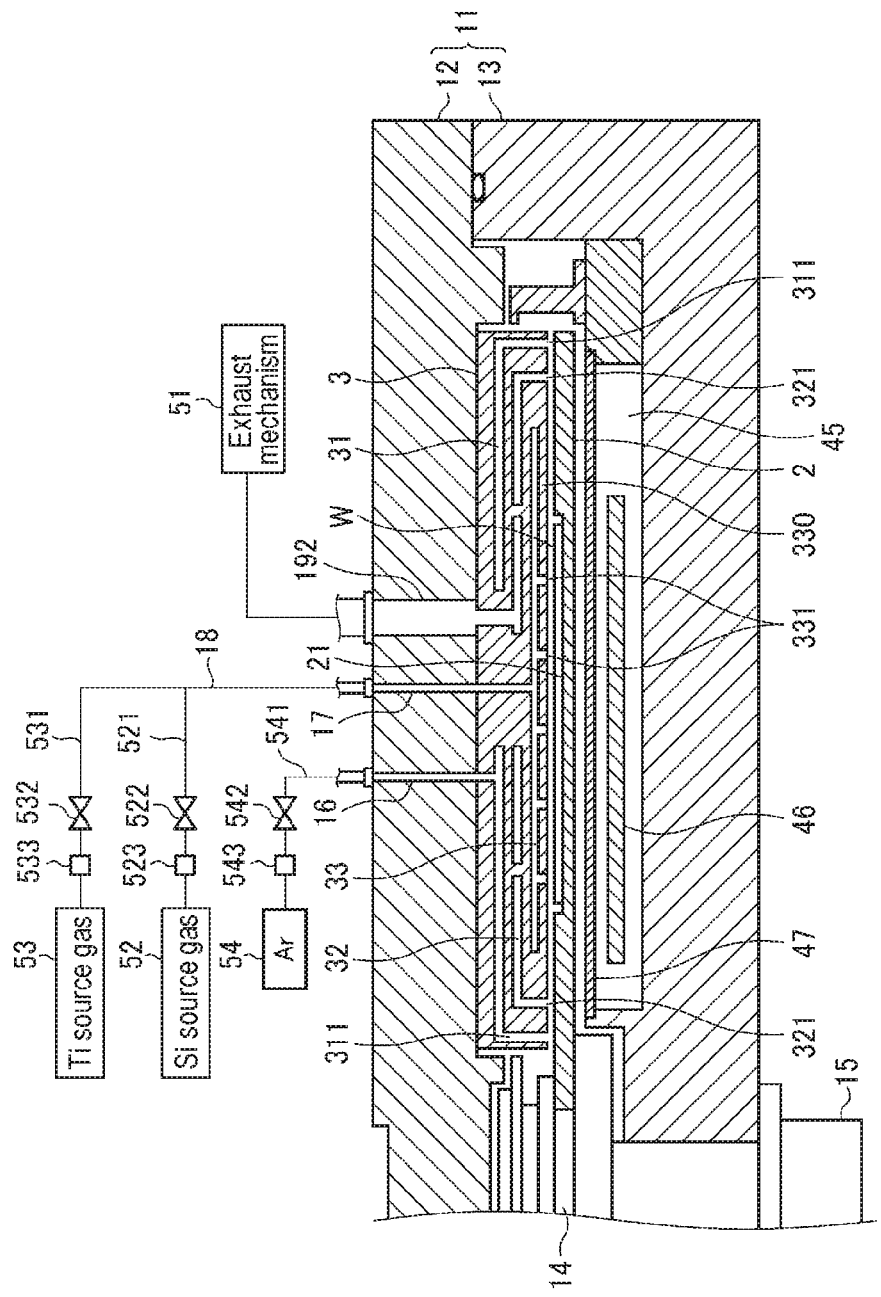
FIG. 4 is an enlarged vertical sectional view showing a first region of the film forming apparatus for carrying out a film forming method according to the present disclosure.
Figure 5:
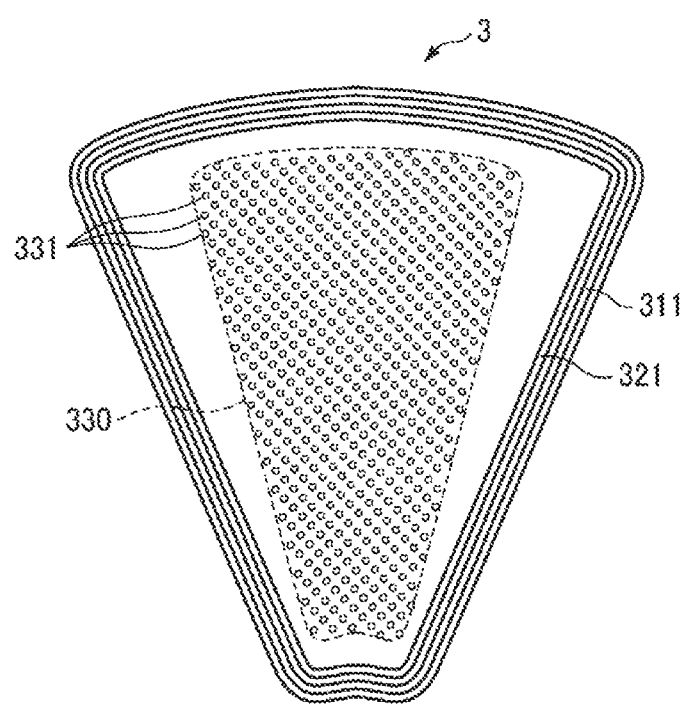
FIG. 5 is a bottom view showing a source gas introduction unit provided in an adsorption region.
Figure 6:
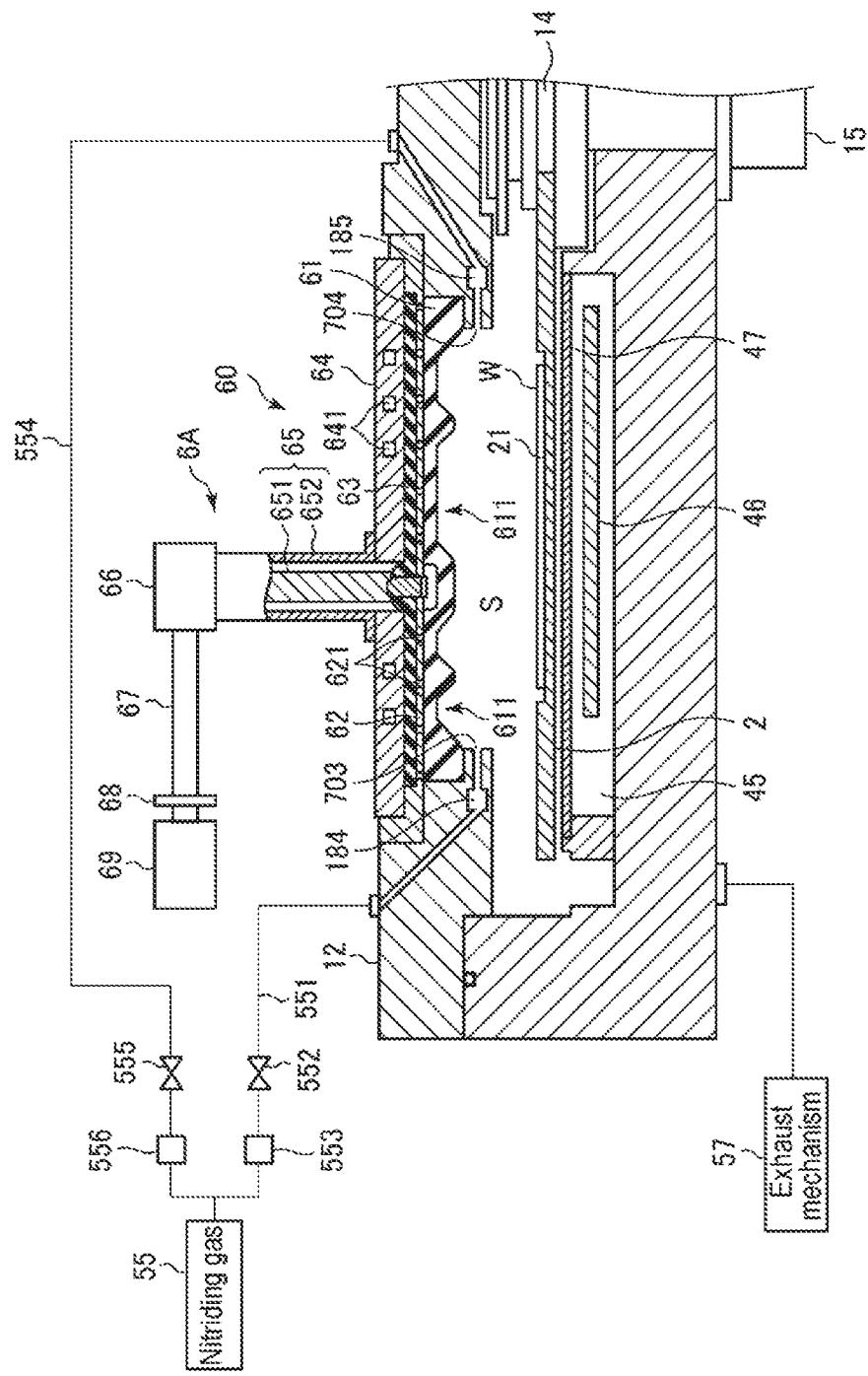
FIG. 6 is an enlarged vertical sectional view showing a nitriding region of the film forming apparatus for carrying out a film forming method according to the present disclosure.

FIG. 1 is a horizontal sectional view of a film forming apparatus according to the present disclosure. FIG. 2 is a vertical sectional view of the film forming apparatus taken along A-A' in FIG. 1. FIG. 3 is a plan view of the film forming apparatus according to the present disclosure. FIG. 4 is an enlarged vertical sectional view of a first region of the film forming apparatus according to the present disclosure. FIG. 5 is a bottom view showing a source gas introduction unit provided in a first region. FIG. 6 is an enlarged vertical sectional view of one nitriding region in a second region of the film forming apparatus according to the present disclosure.

As shown in FIGS. 1 to 6, the film forming apparatus includes a vacuum container 11 that defines a processing space in which a film forming process is performed. In the vacuum container 11, there is disposed a rotary table 2 having a plurality of wafer mounting regions 21 formed therein. A space above the portion of the vacuum container 11 through which the rotary table 2 passes includes an adsorption region R1 in which a Si source gas such as, for example, a dichlorosilane (DCS; $SiH_2Cl_2$) gas, or a Ti source gas containing chlorine (Cl) such as, for example, titanium tetrachloride ($TiCl_4$) is adsorbed onto a wafer W, a nitriding region R2 in which the wafer W is subjected to a nitriding process, and reduction regions R3 and R4 provided on both sides of the nitriding region R2.

A source gas introduction unit 3 for introducing a Si source gas and a Ti source gas into the adsorption region R1 is provided in the upper portion of the adsorption region R1 in the vacuum container 11. A Si source gas supply source 52 and a Ti source gas supply source 53 are connected to the source gas introduction unit 3 via pipes. In addition, a nitriding gas such as, for example, an $NH_3$ gas is supplied from a nitriding gas supply source 55 to the nitriding region R2 via a pipe. A reduction gas such as, for example, a $H_2$ gas is supplied from a reduction gas supply source 56 to the reduction regions R3 and R4 via pipes. In FIG. 1, the pipe for supplying the reduction gas is shown only in the reduction region R3.

Plasma generation parts 6A, 6B and 6C are provided in the nitriding region R2 and the reduction regions R3 and R4, respectively. The gas supply system and the plasma generation parts will be described later in detail.

As shown in FIG. 2, the vacuum container 11 is composed of a container main body 13 which forms a side wall and a bottom of the vacuum container 11, and a top plate 12 which airtightly closes an opening formed on the upper surface side of the container main body 13. The vacuum container 11 is a substantially circular flat container. The vacuum container 11 is made of metal such as, for example, aluminum. The inner surface of the vacuum container 11 is subjected to an anti-plasma treatment such as an anodizing treatment or a ceramic spraying treatment.

The surface of the rotary table 2 is subjected to, for example, the same anti-plasma treatment as the vacuum container 11. A rotary shaft 14 extending vertically downward is provided in the central portion of the rotary table 2. A rotary drive mechanism 15 for rotating the rotary table 2 is provided in the lower end portion of the rotary shaft 14.

On the upper surface of the rotary table 2, as shown in FIG. 1, six wafer mounting regions 21 are equally provided in the circumferential direction. Each of the wafer mounting regions 21 is configured as a circular recess having a diameter slightly larger than that of the wafer W. The number of the wafer mounting regions 21 is not limited to six.

As shown in FIG. 2, an annular groove portion 45 is formed along the circumferential direction of the rotary table 2 on the bottom surface of the container main body 13 positioned below the rotary table 2. In the annular groove portion 45, a heater 46 is provided so as to correspond to the arrangement region of the wafer mounting regions 21. By the heater 46, the wafer W on the rotary table 2 is heated to a predetermined temperature. In addition, the opening on the upper surface of the annular groove portion 45 is closed by a heater cover 47 which is an annular plate member.

As shown in FIGS. 1 and 3, a loading/unloading part 101 for loading and unloading the wafer W is provided on a side wall surface of the vacuum container 11. The loading/unloading part 101 can opened and closed by a gate valve. The wafer W held by an external transfer mechanism is loaded into the vacuum container 11 via the loading/unloading part 101.

In the rotary table 2 having the above-described configuration, if the rotary table 2 is rotated by the rotary shaft 14, each of the wafer mounting regions 21 revolves around the center of rotation. At that time, the wafer mounting regions 21 pass through an annular revolution region $R_A$ indicated by a one-dot chain line.

Next, the adsorption region R1 will be described. As shown in FIG. 2, the source gas introduction unit 3 of the adsorption region R1 is provided on the lower surface side of the top plate 12 facing the upper surface of the rotary table 2. As shown in FIG. 1, the plan-view shape of the source gas introduction unit 3 is a fan shape formed by partitioning the revolution region $R_A$ of the wafer mounting regions 21 in a direction intersecting the revolution direction of the wafer mounting regions 21.

As shown in FIGS. 4 and 5 on an enlarged scale, the source gas introduction unit 3 includes a source gas diffusion space 33 in which a source gas is diffused, an exhaust space 32 in which the source gas is exhausted, and a separation gas diffusion space 31 in which a separation gas for separating a lower region of the source gas introduction unit 3 and an outer region of the source gas introduction unit 3 is diffused. The source gas diffusion space 33, the exhaust space 32 and the separation gas diffusion space 31 are stacked one above another in the named order from the lower side.

A source gas supply path 17 is connected to the source gas diffusion space 33 of the lowermost layer. The source gas supply path 17 is opened on the upper surface of the top plate 12. A source gas supply pipe 18 is connected to the source gas supply path 17. The source gas supply pipe 18 is branched into a Si source pipe 521 and a Ti source pipe 531. A Si source gas supply source 52 for supplying a Si source gas is connected to the Si source pipe 521, and a Ti source gas supply source 53 for supplying a Ti source gas containing Cl is connected to the Ti source pipe 531. An opening/closing valve 522 and a flow rate controller 523 such as a mass flow controller or the like are connected to the Si source pipe 521. In addition, an opening/closing valve 532 and a flow rate controller 533 such as a mass flow controller or the like are connected to the Ti source pipe 531. On the lower surface of the source gas introduction unit 3, there are formed a large number of discharge holes 331 for supplying the source gas from the source gas diffusion space 33 toward side of the rotary table 2.

As the Si source gas, it may be possible to use monosilane ($Si_2H_6$), monochlorosilane (MCS; dichlorosilane (DCS; $SiH_2Cl_2$), trichlorosilane (TCS: $SiHCl_3$), silicon tetrachloride (STC; $SiCl_4$), hexachlorodisilane (HCD; $Si_2Cl_6$) and the like. Among them, DCS may be suitably used.

As the Ti source gas containing Cl, a $TiCl_4$ gas may be suitably used.

The discharge holes 331 are dispersed in a fan-shaped region indicated by a broken line in FIG. 5. The length of the two sides of the fan-shaped region extending in the radial direction of the rotary table 2 is larger than the diameter of the wafer mounting regions 21. Therefore, when the wafer mounting regions 21 pass below the source gas introduction unit 3, the Si source gas or the Ti source gas is supplied from the discharge holes 331 to the entire surface of the wafer W mounted in each of the wafer mounting regions 21.

The fan-shaped region provided with the large number of discharge holes 331 constitutes a discharge part 330 of a film forming source gas. A source gas supply part is configured by the source gas diffusion space 33, the source gas supply path 17, the Si source pipe 521, the Ti source pipe 531, the opening/closing valves 522 and 532, the flow rate controllers 523 and 533, the Si source gas supply source 52 and the Ti source gas supply source 53.

As shown in FIGS. 4 and 5, the exhaust space 32 formed above the source gas diffusion space 33 communicates with an exhaust port 321 extending along a closed path surrounding the discharge part 330. The exhaust space 32 is connected to an exhaust mechanism 51 via an exhaust path 192. There is formed an independent flow path through which the source gas supplied from the source gas diffusion space 33 to the lower side of the source gas introduction unit 3 is led to the exhaust mechanism 51. An exhaust part is configured by the exhaust port 321, the exhaust space 32, the exhaust path 192 and the exhaust mechanism 51.

Further, the separation gas diffusion space 31 formed above the exhaust space 32 communicates with a separation gas supply port 311 extending along a closed path surrounding the exhaust port 321. In addition, a separation gas supply path 16 is connected to the separation gas diffusion space 31. The separation gas supply path 16 is opened on the upper surface of the top plate 12. A separation gas supply pipe 541 is connected to the separation gas supply path 16. A separation gas supply source 54 for supplying a separation gas is connected to the separation gas supply pipe 541. An opening/closing valve 542 and a flow rate controller 543 such as a mass flow controller or the like are connected to the separation gas supply pipe 541. The separation gas that separates the atmospheres inside and outside the separation gas supply port 311 and also serves as a purge gas for removing the source gas excessively adsorbed onto the wafer W is supplied from the separation gas supply source 54. As the separation gas, an inert gas, for example, an Ar gas is used. A separation gas supply part is configured by the separation gas supply port 311, the separation gas diffusion space 31, the separation gas supply path 16, the separation gas supply pipe 541, the opening/closing valve 542, the flow rate controller 543 and the separation gas supply source 54.

In the source gas introduction unit 3, the source gas supplied from the respective discharge holes 331 of the discharge part 330 spreads toward the surroundings while flowing on the upper surface of the rotary table 2 and finally reaches the exhaust port 321. The source gas is exhausted from the upper surface of the rotary table 2. Accordingly, in the vacuum container 11, the region where the source gas exists is limited to the inside of the exhaust port 321 provided along a first closed path. The source gas introduction unit 3 has a shape in which a part of the revolution region $R_A$ of the wafer mounting regions 21 is partitioned in a direction intersecting the revolution direction of the wafer mounting regions 21. Therefore, when the rotary table 2 is rotated, the wafer W mounted on each of the wafer mounting regions 21 passes through the adsorption region R1, whereby the source gas is adsorbed onto the entire surface of the wafer W.

Around the exhaust port 321, the separation gas supply port 311 is provided along a second closed path, and separation gas is supplied from the separation gas supply port 311 toward the upper surface of the rotary table 2. Therefore, the inside and the outside of the adsorption region R1 are doubly separated by the exhaust from the exhaust port 321 and the separation gas supplied from the separation gas supply port 311. Thus, the leakage of the source gas to the outside of the adsorption region R1 and the entry of a gas component from the outside of the adsorption region R1 are effectively suppressed.

The range of the adsorption region R1 may be a range in which a contact time sufficient for causing the source gas to be adsorbed onto the entire surface of the wafer W can be secured and in which the adsorption region R1 does not interfere with the nitriding region R2 where a nitriding process is performed and the reduction regions R3 and R4 where a reduction process is performed, which are provided outside the adsorption region R1.

Next, the nitriding region R2 and the reduction regions R3 and R4 will be described. As described above, the plasma generation parts 6A, 6B and 6C are respectively provided in the nitriding region R2 and the reduction regions R3 and R4 provided on both sides of the nitriding region R2. A nitrogen gas is supplied from the nitriding gas supply source 55 to the nitriding region R2 via a pipe on the inner side and the outer side of the nitriding region R2. A reduction gas is supplied from the reduction gas supply source 56 to the reduction regions R3 and R4 via pipes on the inner side and the outer side of the reduction regions R3 and R4. As the nitriding gas, it may be possible to use an $NH_3$ gas, an $N_2$ gas and the like. Among them, the $NH_3$ gas may be suitably used. As the reduction gas, a $H_2$ gas may be suitably used.

As shown in FIG. 6, the plasma generation part 6A of the nitriding region R2 includes an antenna part 60 configured to radiate microwaves toward the inside of the vacuum container 11, a coaxial waveguide 65 configured to supply microwaves toward the antenna part 60, and a microwave generator 69. The plasma generation part 6A is configured as an RLSA (registered trademark) microwave plasma processing apparatus. The antenna part 60 is provided so as to close a substantially triangular opening formed in the top plate 12 facing the upper surface of the rotary table 2.

The microwave generator 69 generates microwaves having a frequency of, for example, 2.45 GHz. A waveguide 67 is connected to the microwave generator 69, and a tuner 68 for impedance matching is provided in the waveguide 67. The waveguide 67 is connected to a mode converter 66, and the coaxial waveguide 65 extending downward is connected to the mode converter 66. The antenna part 60 is connected to the lower end of the coaxial waveguide 65. The microwaves generated by the microwave generator 69 are propagated to the antenna part 60 through the waveguide 67, the mode converter 66 and the coaxial waveguide 65. The mode converter 66 converts the mode of microwaves into a mode capable of being guided to the coaxial waveguide 65. The coaxial waveguide 65 includes an inner conductor 651 and an outer conductor 652 provided coaxially with the inner conductor 151.

The antenna part 60 is configured as an RLSA (registered trademark) antenna including a dielectric window 61, a planar slot antenna 62, a retardation member 63 and a cooling jacket 64.

The planar slot antenna 62 is formed as a substantially triangular metal plate, and a large number of slots 621 are formed in the planar slot antenna 62. The slots 621 are appropriately set so that the microwaves can be efficiently radiated. For example, the slots 621 are arranged at predetermined intervals in the radial direction extending from the center of the triangular shape toward the peripheral edge and in the circumferential direction. The slots 621 are formed so that the adjacent slots 621 and 621 intersect each other or are orthogonal to each other.

The dielectric window 61 transmits the microwaves transmitted from the coaxial waveguide 65 and radiated from the slots 621 of the planar slot antenna 62. The dielectric window 61 has a function of uniformly generating surface wave plasma in the space above the rotary table 2. The dielectric window 61 is made of ceramics such as, for example, alumina. The dielectric window 61 has a substantially triangular planar shape that can close the opening on the side of the top plate 12. On the lower surface of the dielectric window 61, there is formed an annular recess 611 provided with a tapered surface and configured to stably generate plasma by concentrating the energy of microwaves. The lower surface of the dielectric window 61 may be planar.

The retardation member 63 is provided on the planar slot antenna 62 and is made of a dielectric material having a dielectric constant larger than that of vacuum, for example, ceramics such as alumina or the like. The retardation member 63 is configured to shorten the wavelength of microwaves, and has a substantially triangular plan-view shape corresponding to the dielectric window 61 and the planar slot antenna 62. The cooling jacket 64 is provided on the retardation member 63. A coolant flow path 641 is formed inside the cooling jacket 64. The antenna part 60 can be cooled by allowing a coolant to flow through the coolant flow path 641.

Then, the microwaves generated by the microwave generator 69 pass through the waveguide 67, the mode converter 66, the coaxial waveguide 65 and the retardation member 63 and pass through the slots 621 of the planar slot antenna 62. The microwaves are transmitted through the dielectric window 61 and are supplied to a space S just above the wafer passage region existing under the dielectric window 61.

Peripheral side gas discharge holes 703 for discharging a nitriding gas into a plasma generation space S are formed in a peripheral edge portion of the top plate 12 supporting the dielectric window 61. The peripheral side gas discharge holes 703 are arranged at a plurality of locations, for example, two locations, in a spaced-apart relationship with each other. The peripheral side gas discharge holes 703 communicate with a peripheral side gas supply passage 184 which is opened on the upper surface of the top plate 12. A pipe 551 is connected to the peripheral side gas supply passage 184. The nitriding gas supply source 55 is connected to the pipe 551. An opening/closing valve 552 and a flow rate control part 553 are provided in the pipe 551.

On the other hand, in the central portion of the top plate 12 supporting the dielectric window 61, a central gas discharge hole 704 is formed for discharging a nitriding gas into the plasma generation space S. The central gas discharge hole 704 communicates with a central gas supply passage 185. The central gas supply passage 185 is opened on the upper surface of the top plate 12. A pipe 554 is connected to the central gas supply passage 185. A nitriding gas supply source 55 is connected to the pipe 554. An opening/closing valve 555 and a flow rate control part 556 are provided in the pipe 554.

As a result, the nitriding gas is supplied to the space S just above the wafer passage region to which the microwaves are supplied. Thus, active species of the nitriding gas, for example, $NH_3$ radicals ($NH_3^*$) are generated in the region just above the wafer passage region.

A separate gas supply line may be provided so that a rare gas such as Ar gas or the like can be supplied as a plasma generation gas to the position just below the dielectric window 61.

Figure 7:
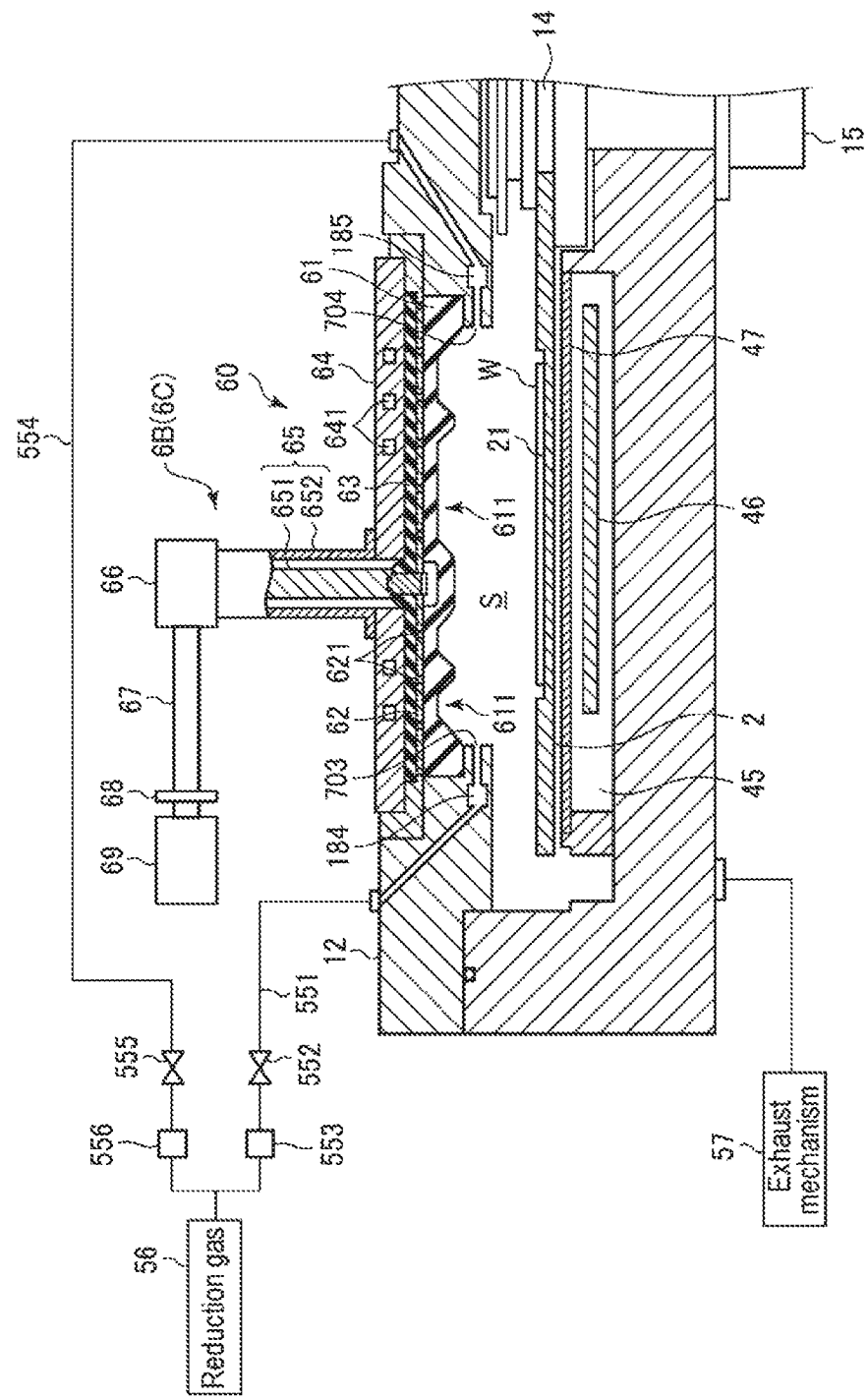
FIG. 7 is a vertical sectional view for explaining a processing operation in a reduction region of the film forming apparatus for carrying out a film forming method according to the present disclosure.

As shown in FIG. 7, the plasma generation parts 6B and 6C in the reduction regions R3 and R4 are configured similarly to the plasma generation part 6A of the nitriding region R2 of FIG. 6, except that, as shown in FIG. 7, each of the plasma generation parts 6B and 6C includes a reduction gas supply source 56 for supplying a reduction gas, for example, a $H_2$ gas, instead of the nitriding gas supply source 55. The supply of the reduction gas from the reduction gas supply source 56 in the reduction regions R3 and R4 is also performed in the same manner as the supply of the nitriding gas in the nitriding region R2. In the reduction regions R3 and R4, the reduction gas is supplied to the space S just above the wafer passage region to which the microwaves are supplied. Active species of the reduction gas, for example, $H_2$ radicals ($H_2^*$) are generated in the region just above the wafer passage region.

As shown in FIG. 1, the processing spaces of the nitriding region R2 and the reduction regions R3 and R4 are evacuated by an exhaust mechanism 57 via four exhaust ports 190A, 190B, 190C and 190D uniformly provided in the outer edge portion of the bottom portion of the container main body 13 of the vacuum container 11.

As shown in FIG. 1, the film forming apparatus includes a control part 8. The control part 8 is configured to control the respective components of the film forming apparatus, for example, the rotary drive mechanism 15 for rotating the rotary table 2, the source gas supply part, the separation gas supply part, a nitriding gas supply part, the plasma generation parts 6A to 6C, etc. The control part 8 includes a main control part composed of a CPU (computer) and configured to perform the aforementioned control, an input device, an output device, a display device and a memory device. A storage medium storing a program for controlling the process to be executed by the film forming apparatus, i.e., a process recipe, is set in the memory device. The main control part calls out for a predetermined process recipe stored in the storage medium and performs control so that a predetermined process is performed by the film forming apparatus 100 based on the process recipe.

<Silicon Nitride Film Forming Method>

Next, an embodiment of a silicon nitride film forming method using the film forming apparatus configured as above will be described with reference to a flowchart of FIG. 8.

Conventionally, the formation of a silicon nitride film by the ALD method is performed by plasma ALD in which a dichlorosilane (DCS; $SiH_2Cl_2$) gas, which is a Si source gas, and an ammonia ($NH_3$) gas, which is a nitriding gas, are used and supplied alternately, and high-frequency power is applied, when supplying the $NH_3$ gas, to generate plasma and promote a nitriding reaction. Although a silicon nitride film having a high quality and a high insulating property can be obtained by the plasma ALD, there is a growing demand for a dry etching resistance in the silicon nitride film. It is difficult to obtain a sufficient dry etching resistance in a silicon nitride film produced by a conventional ALD method.

Therefore, in the present embodiment, using the film forming apparatus described above, a silicon nitride film (SiN film) formed by the ALD method and a titanium nitride film (TiN film) formed by the ALD method are laminated at a predetermined ratio to form a silicon nitride film doped with a small amount of titanium.

Since titanium nitride has a higher etching resistance than silicon nitride, it is possible to remarkably increase an etching resistance while maintaining a high film quality, by doping a small amount of titanium in this manner.

Figure 8:
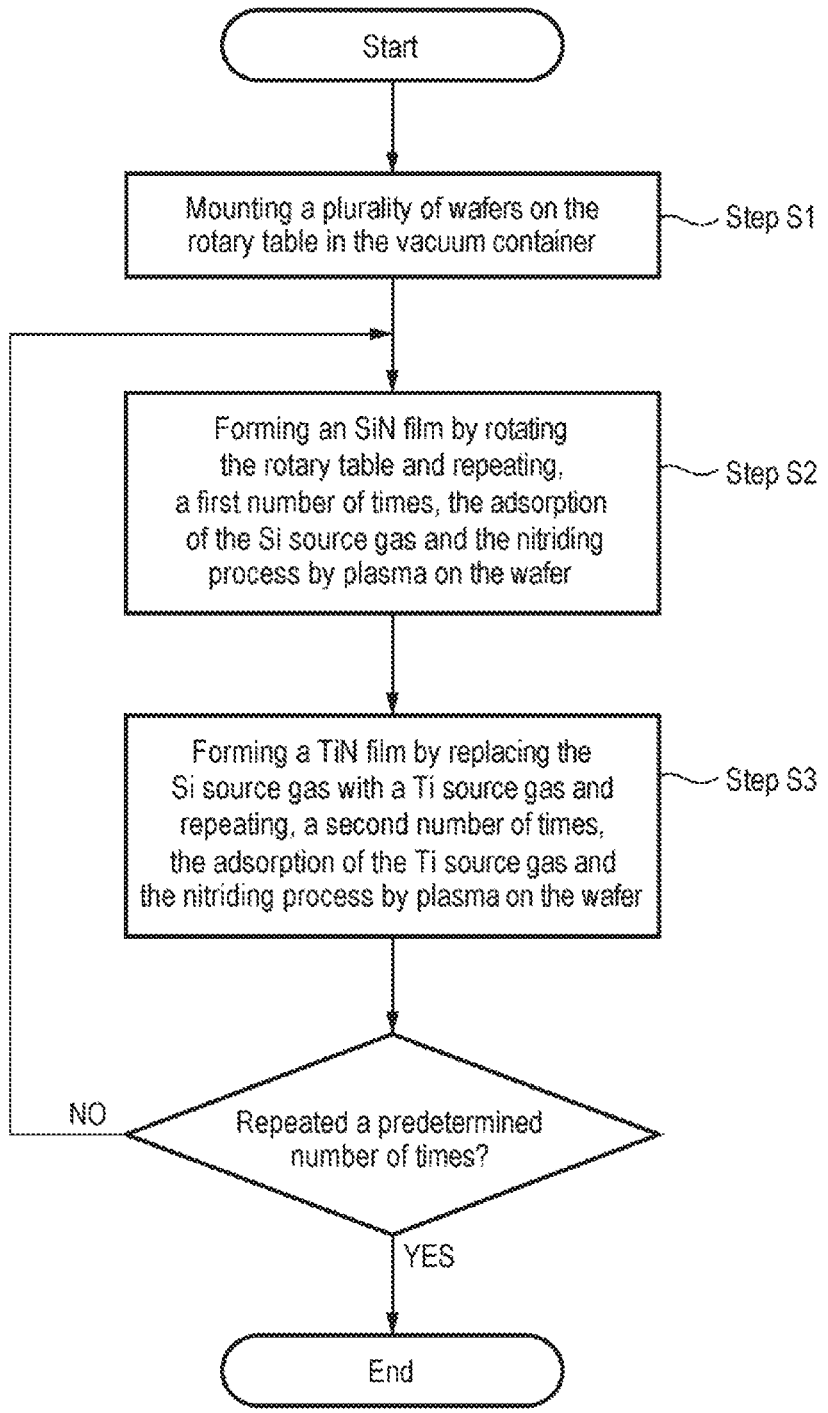
FIG. 8 is a flowchart showing one embodiment of a film forming method according to the present disclosure.

When forming such a silicon nitride film by using the film forming apparatus, as shown in FIG. 8, the gate valve of the loading/unloading part 101 is first opened. A plurality of wafers W is loaded into the vacuum container 11 by the external transfer mechanism and is mounted on the wafer mounting regions 21 of the rotary table 2 (step S1).

The transfer of the wafers W is performed by intermittently rotating the rotary table 2, whereby the wafers W are mounted on all the wafer mounting regions 21. After the mounting of the wafers W is completed, the transfer mechanism is retracted and the gate valve of the loading/unloading part 101 is closed. At this time, the interior of the vacuum container 11 is evacuated to a predetermined pressure in advance by the exhaust mechanisms 51 and 57. In addition, a separation gas, for example, an Ar gas, is supplied from the separation gas supply port 311.

Next, the temperature of the wafers W mounted on the rotary table 2 is raised to a predetermined set temperature by the heater 46 based on the detection value of a temperature sensor (not shown). The supply of the Si source gas to the adsorption region R1 in the vacuum container 11, the supply of the $NH_3$ gas for a nitriding process to the nitriding region R2 and the supply of the microwaves from the microwave generation parts 6A to 6C are started. The rotary table 2 is rotated clockwise at a predetermined speed. On the wafers W, the adsorption of the Si source gas and the nitriding process by plasma are alternately repeated a first number of times. A SiN film having a predetermined thickness is formed by the ALD method (step S2).

Subsequently, while rotating the rotary table 2 clockwise at a predetermined speed, the gas supplied to the adsorption region R1 is replaced by the Ti source gas containing Cl. On the wafers W, the adsorption of the Ti source gas and the nitriding process by plasma are alternately repeated a second number of times. A TiN film having a predetermined thickness is formed by the ALD method (step S3).

By repeating step S2 and step S3 a predetermined number of times, a silicon nitride film doped with Ti, which has a predetermined film thickness, can be formed.

At this time, the doping amount of Ti can be controlled by adjusting the first number of times, which is a number of repetition times of step S2, and the second number of times, which is a number of repetition times of step S3.

In this case, the doping amount of Ti is preferably in a range where the etching resistance can be effectively enhanced and the film quality can be kept high. As the Ti doping amount increases, the etching resistance can be enhanced. However, when the Ti doping amount is too large, the film quality cannot be maintained. In consideration of this point, TiN is preferably added in an amount of 0.1 to 2 mol % with respect to the entirety of the film.

Figure 9:
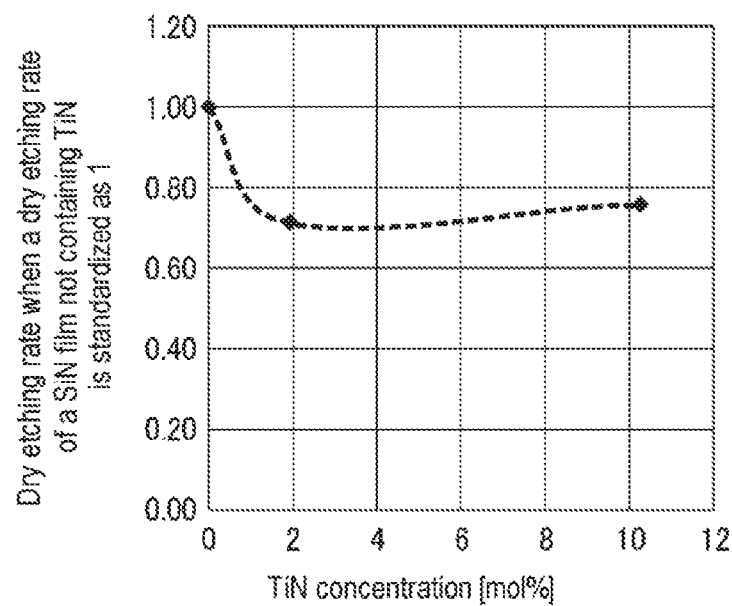
FIG. 9 is a view showing the relationship between a TiN concentration in a SiN film and a dry etching rate when a dry etching rate of a SiN film not containing TiN is standardized as 1.

Experimental results showing this fact will be described. FIG. 9 is a view showing the relationship between a TiN concentration in a SiN film and a dry etching rate when a dry etching rate of a SiN film not containing TiN is standardized as 1. As an etching gas, $C_4F_6/Ar/O_2$ was used. As shown in FIG. 9, it is understood that when adding TiN by a small amount of about 0.1 mol %, the etching rate sharply decreases, namely the dry etching resistance becomes high.

Figure 10:
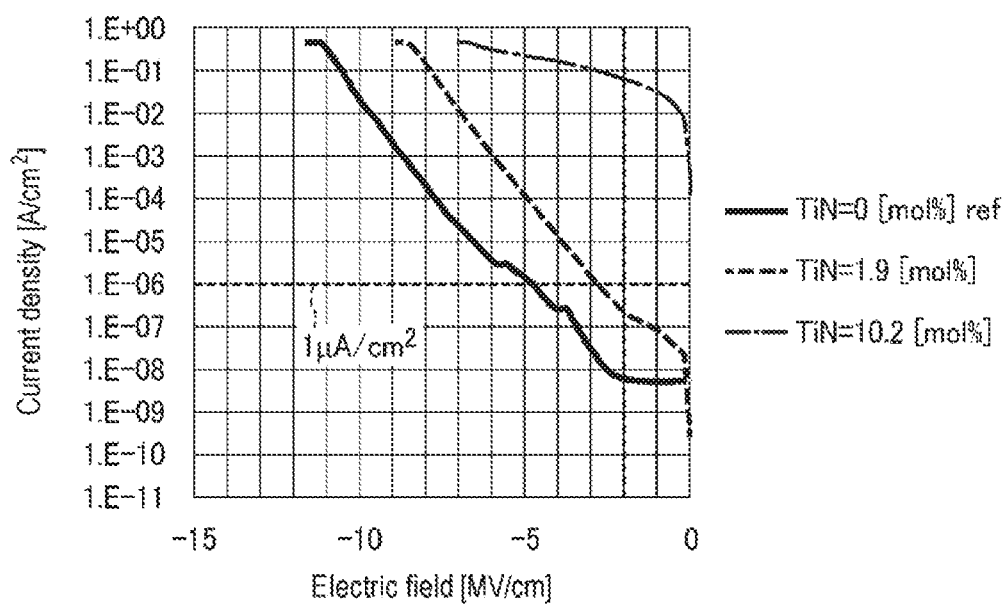
FIG. 10 is a view showing leakage current characteristics when a SiN film is not doped with Ti (0 mol %) and when a SiN film is doped with Ti so that TiN is 1.9 mol % and 10.2 mol %.

FIG. 10 is a view showing leakage current characteristics when a SiN film is not doped with Ti (0 mol %) and when a SiN film is doped with Ti so that TiN is 1.9 mol % and 10.2 mol %. As shown in FIG. 10, when the TiN doping amount is 1.9 mol %, the leakage current characteristic falls within an allowable range (where the electric field is −2 MV/cm and the leakage current density is 1 µA/cm² or less), but when the TiN doping amount is 10.2 mol %, the leakage current characteristic deteriorates. That is, the leakage current characteristic of the SiN film deteriorates as the Ti doping amount (TiN adding amount) increases. It is understood that TiN is preferably 2 mol % or less.

The doping amount of Ti is determined by the ratio of the number of rotations of the rotary table 2 in step S2, i.e., the film thickness of the SiN film, and the number of rotations of the rotary table 2 in step S3, i.e., the film thickness of the TIN film. For example, assuming that the thickness of the SiN film per revolution of the rotary table 2 is the same as the film thickness of the TiN film per revolution of the rotary table 2, when it is desired to set TiN to 5 mol %, the ratio is set such that the number of revolutions of the rotary table 2 in step S2 is 19 revolutions and the number of revolutions of the rotary table 2 in step S3 is 1 revolution. This is repeated until the film thickness reaches a predetermined thickness. In addition, when it is desired to set TiN to 2 mol %, the ratio is set such that the number of revolutions of the rotary table 2 in step S2 is 49 revolutions and the number of revolutions of the rotary table 2 in step S3 is 1 revolution. This is repeated until the film thickness reaches a predetermined thickness.

In this manner, by using the microwave plasma during the nitriding process, it is possible to generate high density plasma at a low electron temperature and to perform a process based mainly on radicals. Therefore, a silicon nitride film with a better film quality can be formed.

Preferred conditions for film formation are as follows.
Film forming temperature: 400 to 600 degrees C.
Pressure: 66.6~1330 Pa
Si source gas (DCS gas) flow rate: 600 to 1200 sccm
Ti source gas ($TiCl_4$ gas) flow rate: 100 to 200 sccm
Nitriding gas ($NH_3$ gas) flow rate: 80 to 4000 sccm
Microwave power: 1000 to 2500 W Incidentally, as the Ti source gas for forming the TiN film, a gas containing chlorine, for example, a $TiCl_4$ gas is used. However, when the $TiCl_4$ gas is nitrided by exciting a nitriding gas such as an $NH_3$ gas or the like with microwave plasma after the $TiCl_4$ gas is adsorbed. Cl tends to remain in the TiN film thus formed.

Therefore, in the present embodiment, the reduction regions R3 and R4 are provided on both sides of the nitriding region R2. When a TiN film is formed, a reduction gas, for example, a $H_2$ gas, is supplied to the wafer W passing through the reduction regions R3 and R4 and is excited by microwave plasma. Thus, the adsorbed Ti source material is reduced by the active species of the reduction gas, for example, $H_2$* (H*). As a result, it is possible to effectively reduce the residual chlorine in the film and to reduce the amount of residual chlorine.

Figure 11:
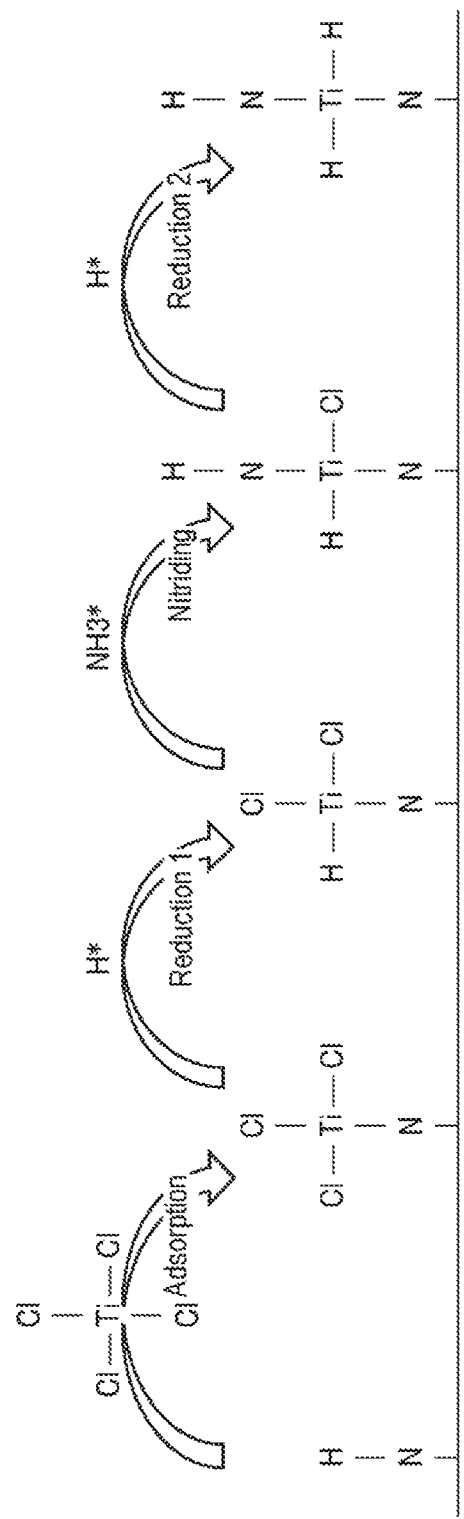
FIG. 11 is a view for explaining a preferred sequence and a preferred mechanism when a TiN film is formed in a film forming method according to the present disclosure.

The sequence and the mechanism at this time will be described in detail with reference to FIG. 11. In this example, description will be made on a case where a TiN film is formed on the nitrided surface of a SiN film by using a $TiCl_4$ gas as a Ti source gas, using a $H_2$ gas as a reduction gas, and using an $NH_3$ gas as a nitriding gas.

First, in the adsorption region R1, a $TiCl_4$ gas is adsorbed onto the nitrided surface of the wafer W (adsorption step).

Next, in the reduction region R3, a first reduction process is performed with H* generated by exciting a $H_2$ gas by microwave plasma (reduction step 1). At this time, if Cl of $TiCl_4$ is completely replaced with H, the nitriding reaction by $NH_3$ does not occur during the next nitriding process. Thus, the reduction is stopped with a —Cl group left. At this time, the reduction target is $TiCl_4$ in a state immediately after adsorption. Since $TiCl_4$ is still in an unstable state, it is easily reducible.

Next, in the nitriding region R2, a nitriding process is performed with $NH_3$* generated by exciting an $NH_3$ gas by microwave plasma (nitriding step). At this time, $NH_3$* reacts with the —Cl group bonded to Ti, thereby nitriding Ti. However, a part of the —Cl group remains.

Subsequently, in the reduction region R4, a second reduction is performed with H* generated by exciting a $H_2$ gas by microwave plasma (reduction step 2). As a result, Cl remaining after the nitriding process is almost completely reduced.

In this way, by performing the reduction process with the $H_2$ plasma before and after the nitriding process by the plasma at the time of forming the TiN film in step S3, it is possible to remove Cl which is likely to remain in the film. This makes it possible to form a high-quality TiN film containing an extremely small amount of Cl. Therefore, the film quality of the silicon nitride film doped with Ti can be improved. In addition, since the process is a reduction process using plasma, the effect of reducing and removing Cl is high.

Preferred conditions for the reduction process in this case are as follows in both of reduction step 1 and reduction step 2.
$H_2$ gas flow rate: 100 to 4000 sccm
Microwave power: 1000 to 2500 W The reduction process performed before and after the nitriding process as described above is effectively performed at the time of forming the TiN film in step S3. However, the reduction process may be performed at the time of forming the SiN film in step S2. In particular, even when a Si source gas containing chlorine such as DCS or the like is used, the amount of Cl not as much as when using $TiCl_4$ is incorporated into the film. Thus, it is preferable to perform the reduction process before and after the nitriding process.

A specific sequence in the case of forming a SiN film by using a DCS gas as a Si source gas, using a $H_2$ gas as a reduction gas, and using an $NH_3$ gas as a nitriding gas is as follows.

That is, in the adsorption region R1, a DCS gas is first adsorbed onto the nitrified surface of the wafer W. Then, in the reduction region R3, a first reduction is performed by $H_2$* generated by exciting a $H_2$ gas with microwave plasma. Next, in the nitriding region R2, a nitriding process is performed by $NH_3$* generated by exciting an $NH_3$ gas with microwave plasma. Next, in the reduction region R4, a second reduction is performed by $H_2$* generated by exciting a $H_2$ gas with microwave plasma.

As described above, even at the time of forming the SiN film in step S2, by performing the reduction process by the $H_2$ plasma before and after the nitriding process by the plasma, Cl in the film can be extracted even when the SiN film is formed. It is therefore possible to reduce the Cl content in the SiN film and to further improve the film quality of the silicon nitride film doped with Ti.

<Other Application>

While the embodiment of the present disclosure has been described above, the present disclosure is not limited to the above-described embodiment. Various modifications may be made without departing from the spirit of the present disclosure.

For example, in the above-described embodiment, there has been described a case where, by rotating the rotary table on which a plurality of wafers is mounted, the silicon nitride film doped with Ti is formed by the rotary film forming apparatus that alternately performs the adsorption of a source gas and the nitriding process, preferably a case where the film forming apparatus having the reduction regions before and after the nitriding region is used in order to remove Cl in the film. However, it is also possible to use a single-wafer type film forming apparatus that repeats the supply of a source gas, the purging, the nitriding process and the purging, or repeats the supply of a source gas, the purging, the reduction process, the nitriding process, the reduction process and the purging.

In the above-described embodiment, there has been described an example in which the microwave plasma is used as the plasma in the nitriding process and the reduction process. However, the present disclosure is not limited thereto. Other plasma such as inductively coupled plasma or the like may also be used.

According to the present disclosure in some embodiments, a silicon nitride film doped with a predetermined amount of titanium is formed by repeating, a predetermined number of times, a step of forming a silicon nitride film by repeating, a first number of times, a process of causing a silicon source gas to be adsorbed onto a substrate and a process of nitriding the adsorbed silicon source gas with plasma of a nitriding gas, and a step of forming a titanium nitride film by repeating, a second number of times, a process of causing a titanium source gas containing chlorine to be adsorbed onto the substrate and a process of nitriding the adsorbed titanium source gas with the plasma of the nitriding gas. Therefore, it is possible to form a silicon nitride film having a good film quality and a sufficient dry etching resistance.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A silicon nitride film forming method for forming a silicon nitride film on a substrate to be processed, comprising:
    forming a silicon nitride film doped with a predetermined amount of titanium by repeating, a predetermined number of times,
        forming a silicon nitride film by repeating, a first number of times, a process of causing a silicon source gas to be adsorbed onto the substrate and a process of nitriding the adsorbed silicon source gas with plasma of a nitriding gas, and
        forming a titanium nitride film by repeating, a second number of times, a process of causing a titanium source gas containing chlorine to be adsorbed onto the substrate and a process of nitriding the adsorbed titanium source gas with the plasma of the nitriding gas,
    wherein when performing the forming a titanium nitride film, a process of reducing the adsorbed titanium source by plasma of a reduction gas is performed before and after the nitriding process.

2. The method of claim 1, wherein a doping amount of titanium is controlled by adjusting the first number of times and the second number of times.

3. The method of claim 2, wherein an amount of TiN with respect to an entirety of the silicon nitride film doped with a predetermined amount of titanium is in a range of 0.1 to 2 mol %.

4. The method of claim 1, wherein the nitriding process is performed by using an $NH_3$ gas as the nitriding gas.

5. The method of claim 1, wherein the nitriding process is performed by nitriding species generated by exciting the nitriding gas with microwave plasma.

6. The method of claim 1, wherein a $TiCl_4$ gas is used as the titanium source gas containing chlorine used in the forming a titanium nitride film.

7. The method of claim 1, wherein an adsorption region for causing the silicon source gas or the titanium source gas to be adsorbed and a nitriding region for nitriding the adsorbed silicon source gas or the adsorbed titanium source gas are provided in a vacuum container,
    a plurality of substrates mounted on a rotary table is revolved in the vacuum container so that the substrates sequentially pass through the adsorption region and the nitriding region, and
    a process of causing the silicon source gas or the titanium source gas to be adsorbed and a process of nitriding the adsorbed silicon source or the adsorbed titanium source are performed alternately.

8. The method of claim 1, wherein an adsorption region for causing the silicon source gas or the titanium source gas to be adsorbed, a nitriding region for nitriding the adsorbed silicon source gas or the adsorbed titanium source gas and reduction regions for performing a reduction process by the plasma of the reduction gas before and after the nitriding region are provided in a vacuum container,
    a plurality of substrates mounted on a rotary table is revolved in the vacuum container so that the substrates sequentially pass through the adsorption region, one of the reduction regions, the nitriding region and the other of the reduction regions, and
    in the forming a titanium nitride film, a process of causing the titanium source gas to be adsorbed, a process of reducing the adsorbed titanium source, a process of nitriding the adsorbed titanium source gas and a process of reducing the nitrided titanium source gas are sequentially performed.

9. The method of claim 1, wherein when performing the forming a silicon nitride film, a process of reducing the adsorbed silicon source by the plasma of the reduction gas is performed before and after the nitriding process.

10. The method of claim 9, wherein an adsorption region for causing the silicon source gas or the titanium source gas to be adsorbed, a nitriding region for nitriding the adsorbed silicon source gas or the adsorbed titanium source gas and reduction regions for performing a reduction process by the plasma of the reduction gas before and after the nitriding region are provided in a vacuum container,
    a plurality of substrates mounted on a rotary table is revolved in the vacuum container so that the substrates sequentially pass through the adsorption region, one of the reduction regions, the nitriding region and the other of the reduction regions,
    in the forming a titanium nitride film, a process of causing the titanium source gas to be adsorbed, a process of reducing the adsorbed titanium source gas, a process of nitriding the adsorbed titanium source gas and a process of reducing the nitrided titanium source are sequentially performed, and
    in the forming a silicon nitride film, a process of causing the silicon source gas to be adsorbed, a process of reducing the adsorbed silicon source gas, a process of nitriding the adsorbed silicon source gas and a process of reducing the nitrided silicon source are sequentially performed.

11. The method of claim 1, wherein the reducing process is performed using a $H_2$ gas as the reduction gas.

12. The method of claim 1, wherein the reducing process is performed by reducing species generated by exciting the reduction gas with microwave plasma.

* * * * *